United States Patent
Eddleman et al.

(10) Patent No.: US 9,634,481 B2
(45) Date of Patent: Apr. 25, 2017

(54) MOSFET PROTECTION USING RESISTOR-CAPACITOR THERMAL NETWORK

(71) Applicant: LINEAR TECHNOLOGY CORPORATION, Milpitas, CA (US)

(72) Inventors: Daniel James Eddleman, San Jose, CA (US); Mitchell Edward Lee, San Jose, CA (US); Zhizhong Hou, Fremont, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 15/088,714

(22) Filed: Apr. 1, 2016

(65) Prior Publication Data

US 2016/0218501 A1 Jul. 28, 2016

Related U.S. Application Data

(62) Division of application No. 14/486,697, filed on Sep. 15, 2014.

(Continued)

(51) Int. Cl.
*H02H 5/04* (2006.01)
*H03K 17/082* (2006.01)
*H03K 17/08* (2006.01)

(52) U.S. Cl.
CPC ........... *H02H 5/04* (2013.01); *H03K 17/0822* (2013.01); *H03K 2017/0806* (2013.01)

(58) Field of Classification Search
CPC ......... H03K 17/08104; H03K 17/0822; H02H 9/001–9/004; H02H 5/04–5/48
See application file for complete search history.

(56) References Cited

U.S. PATENT DOCUMENTS

| 8,299,767 B1 * | 10/2012 | Tuozzolo | ........... H03K 17/0822 323/275 |
| 2009/0091373 A1 * | 4/2009 | Kiyohara | ................ H03L 1/022 327/512 |

OTHER PUBLICATIONS

Positive Low Voltage (0.9V to 14V) Hot Swap Controller and Circuit Breaker with True-SOA™, PICOR Semiconductor Power Solutions, P12211 Cool-Swap™, Rev 1.0, pp. 1-26.

(Continued)

*Primary Examiner* — Stephen W Jackson
*Assistant Examiner* — Christopher Clark
(74) *Attorney, Agent, or Firm* — McDermott Will & Emery LLP

(57) ABSTRACT

A circuit for protecting a semiconductor element is provided in a system for supplying power from an input node to an output node. The circuit has an analog multiplier responsive to a voltage across the semiconductor element and a current flowing through the semiconductor element to produce an output voltage. A transconductance amplifier is coupled to an output of the analog multiplier for receiving the output voltage of the analog multiplier to produce an output current. An analog RC circuit coupled to the output of the transconductance amplifier is configurable to include a selected number of resistive elements having selected resistance values and a selected number of capacitive elements having selected capacitance values. The configuration of the RC circuit is carried out to provide an RC thermal model that reproduces a desired thermal behavior of the semiconductor element. The RC circuit is responsive to the output current of the transconductance amplifier to produce an output voltage used to control the semiconductor element.

11 Claims, 5 Drawing Sheets

Related U.S. Application Data

(60) Provisional application No. 61/900,832, filed on Nov. 6, 2013.

(56) References Cited

OTHER PUBLICATIONS

Non-final Office Action U.S. Appl. No. 14/486,697 dated Jul. 12, 2016.
Notice of Allowance U.S. Appl. No. 14/866,697 dated Dec. 16, 2016.

* cited by examiner

MOSFET PROTECTION USING RESISTOR-CAPACITOR THERMAL NETWORK

RELATED APPLICATIONS

This application is a Divisional Application of U.S. Ser. No. 14/486,697, filed Sep. 15, 2015, which claims priority of U.S. provisional application No. 61/900,832, filed on Nov. 6, 2013. The subject matter of each is incorporated herein by reference in entirety.

TECHNICAL FIELD

This disclosure relates to circuits for protecting semiconductor elements in electrical systems. In particular, the disclosure presents ways to protect semiconductor elements, such as MOSFETs, from excessive heating.

BACKGROUND ART

A hot swap circuit applies power from an input source to a load in a controlled and protected fashion. One function of such a controller is to limit inrush currents from the power source to the load, especially load capacitance, when power is first applied or if the power source voltage suddenly increases. Another function is to limit current if the load attempts to draw too much current, for example if there is a short circuit in the load.

FIG. 1 shows a hot swap circuit that uses a single MOSFET 100 (Q1) in series with a current sense resistor 102 along with control circuitry for limiting current. Numerous such circuits are commercially available. When limiting current, a current limit amplifier 106 adjusts the MOSFET gate to source voltage in order to limit the voltage across the current sense resistor 102 and thus the current through the MOSFET 100. The current limit amplifier 106 compares a voltage representing the current in the current sense resistor 102 with a voltage VLIMIT produced by a voltage source 104 to control the gate of the MOSFET 100 so as to reduce the output current when the sensed current exceeds a maximum value established by the voltage VLIMIT. A current source 108 is provided for pulling up the gate voltage. A transistor 110 is provided for turning the hot swap circuit on or off.

During this time, the voltage and current through the MOSFET can both be large, resulting in high power dissipation in the MOSFET. If this power dissipation persists, the MOSFET can reach temperatures that cause damage. MOSFET manufacturers present the safe limits on MOSFET voltage, current, and time as a curve referred to as the Safe Operating Area (SOA). Commonly, a timer circuit sets a maximum time for the MOSFET to operate in a current limit mode. When this time expires, the MOSFET is turned off to protect it from overheating. The load will lose power and the hot swap controller will indicate that a fault has occurred. The timer circuit may include a timer capacitor $C_{TIMER}$ coupled to a 2 µA current source 112, which via a switch S1 is coupled to a 100 µA current source 114. The switch S1 is controlled by a control signal produced at the status node of the current limit amplifier 106 that indicates whenever the current limit amplifier 106 limits the current.

Often high power hot swap applications need to charge large bypass capacitors 126 (CL) across the load. To reduce stress on the MOSFET 100, the load may be kept off until the bypass capacitors 126 are charged. A small charging current for the capacitance keeps the power in the MOSFET 100 low enough to prevent a dangerous rise in temperature.

However, in the method described above, the timer runs at an equal rate any time the circuit is in a current limit mode. The timer time-out, at a minimum, must be set to allow the circuit to completely charge the bypass capacitor 126 from ground. An even longer time-out setting may be required if another allowable operating condition, such as a fast increase in the input supply voltage or the presence of a load current during start-up, causes an even longer duration current-limit event. A MOSFET 100 must be selected that can withstand the worst-case SOA condition that occurs during any possible normal operating condition or fault condition. Fault conditions may include events such as start-up into a short circuit that will result in the entire supply voltage being imposed across the MOSFET 100 for the time-out duration. This is a fault condition that requires a greater SOA of the MOSFET 100 than any normal operating condition.

With the previously described method, the worst-case SOA condition occurs during a fault condition, and the customer must select a MOSFET 100 that survives this condition. The worst-case condition is not always readily apparent, and determining the worst-case condition is sometimes the most challenging aspect of designing a hot swap circuit.

Therefore, there is a need for circuit and methodology for MOSFET protection that would overcome the disadvantages discussed above.

SUMMARY OF THE DISCLOSURE

The present disclosure offers a circuit for protecting a semiconductor element in a system for supplying power from an input node to an output node. The circuit comprises an analog multiplier responsive to a voltage across the semiconductor element and a current flowing through the semiconductor element to produce an output voltage. A transconductance amplifier is coupled to an output of the analog multiplier for receiving the output voltage of the analog multiplier to produce an output current. An analog RC circuit coupled to the output of the transconductance amplifier is configurable to include a selected number of resistive elements having selected resistance values and a selected number of capacitive elements having selected capacitance values. The configuration of the RC circuit is carried out to provide an RC thermal model that reproduces a desired thermal behavior of the semiconductor element.

The RC circuit is responsive to the output current of the transconductance amplifier to produce an output voltage. A comparator compares the output voltage of the RC circuit with a reference voltage to produce a control signal supplied to the semiconductor element.

In accordance with one aspect of the disclosure, the semiconductor element may include a MOSFET. A sense resistor may be coupled to the MOSFET for sensing the MOSFET current.

A first input of the analog multiplier may be configured for receiving a voltage across the sense resistor, and a second input of the analog multiplier may be configured for receiving a voltage between source and drain terminals of the MOSFET.

For example, the MOSFET may be arranged in a hot swap circuit.

Also, the MOSFET may be configured in a surge stopper circuit. A surge stopper circuit contains all of the functionality of a hot swap circuit, and adds the ability to limit the output voltage to a maximum value. The surge stopper circuit may include a resistor divider coupled to the output node, and a feedback node provided in a common node between resistive elements of the resistor divider. If the output voltage of the surge stopper circuit rises to a level that causes the feedback node to reach a reference voltage, a voltage limit amplifier drives the gate of the MOSFET to regulate the feedback node at the reference voltage. A switch is turned on, enabling the TIMER pullup current, when the current limit amplifier is active and limiting the MOSFET current or the voltage limit amplifier is active and limiting the output voltage. The TIMER pullup current limits the amount of time that the current limit or voltage limit is active to protect the MOSFET.

The output current of the transconductance amplifier in the hot swap and surge stopper circuits is proportional to the power dissipated by the MOSFET.

If the MOSFET current is limited to a fixed maximum value, which is common in hot swap and surge stopper circuits, the voltage across the MOSFET's drain and source is indicative of the power dissipation of the MOSFET. When the current is below the maximum value, the voltage between the drain and source is negligible and the MOSFET's power dissipation is negligible. As a result, when the MOSFET current is limited to a fixed maximum value, the analog multiplier may be implemented by a circuit that produces an output voltage that is proportional to the voltage across the MOSFET's drain and source.

For example, the RC circuit may represent a Cauer thermal model or a Foster thermal model. More generally, it may be formed of any network of resistors and capacitors that produces an output voltage proportional to the MOSFET silicon junction temperature when a current proportional to power is input to the network.

In accordance with a further aspect, the present disclosure provides a method of protecting a MOSFET in a system for supplying power from an input node to an output node. The method involves configuring an analog RC circuit to represent a thermal model of the MOSFET reproducing a desired thermal behavior of the MOSFET.

Using an analog multiplier, the power dissipation of the MOSFET may be determined as a product of a MOSFET current and a voltage across the MOSFET. Further, a current proportional to the power dissipation of the MOSFET may be produced and supplied to the RC circuit. A voltage produced by the RC circuit in response to the produced current is compared with a reference value to control switching of the MOSFET.

The analog RC circuit may be configured by including a selected number of resistive elements and a selected number of capacitive elements, and selecting desired resistance values of the resistive elements and desired capacitance values of the capacitive elements.

An additional implementation may include a method to detect the case temperature of the MOSFET. This may reduce the number of resistor and capacitor elements required in the RC thermal model because only the temperature difference between the silicon junction and the case temperature of the MOSFET is modeled. Typically, the time constant from the silicon junction to the case of the MOSFET is between 10 ms and 1 second. If the MOSFET case temperature is not sensed, it may be necessary to include the board temperature behavior in the RC thermal model. This time constant may be several minutes. Modeling both short and long times accurately with a single thermal model requires more resistors and capacitors than representing only shorter times or longer times accurately. Additionally, when modeling both short and long time constants in a single thermal model, the analog multiplier and transconductance amplifier must be accurate over a wide range of power inputs which may be difficult to design. This temperature sensing behavior may be implemented using a resistive divider where the top resistor has a positive temperature coefficient and is electrically connected to the MOSFET drain and is in close proximity on the board. Resistors with accurately specified temperature coefficients are widely available at relatively low cost. This results in a circuit that crosses a threshold (and results in the MOSFET turning off) when the MOSFET case temperature rises above a predetermined temperature.

In another implementation, the case temperature may be sensed by an element such as a diode-connected NPN transistor. A voltage that is proportional to the MOSFET case temperature is output at a temperature sensing node connected to a node in the thermal network that represents case temperature. For example, in the Cauer network, the temperature sensing node is connected in series with the last resistor in the network.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

Figure 2:
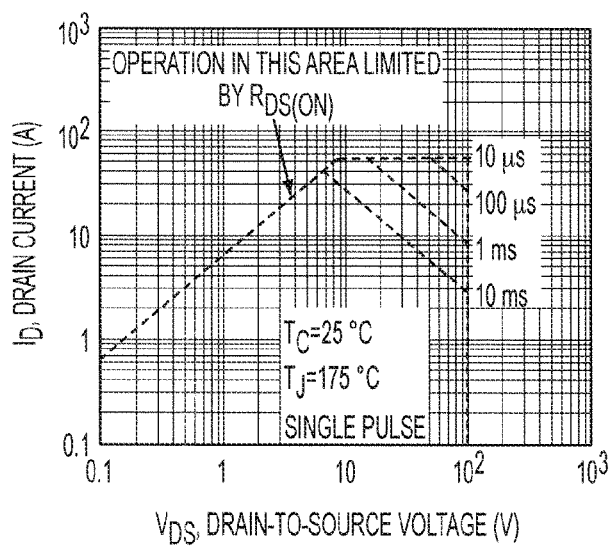
FIG. 2 presents an example of a safe operating area (SOA) plot.

The present disclosure provides a technique for ensuring that the safe operating area (SOA) of a MOSFET is not exceeded. Historically, the circuit designer has relied on a "safe operating area" (SOA) plot to judge the capability of the MOSFET. An example of the SOA plot reproduced from the Vishay IRF530 datasheet is illustrated in FIG. 2. Cost and physical size of a MOSFET are generally proportional to its SOA capability, so a designer would like to minimize the required safe operating area while safely powering up the output or riding through momentary overload events.

MOSFET safe operating area is limited by the maximum allowable junction temperature of the MOSFET die. In FIG. 2, the maximum junction temperature is specified as 175° C. when the case temperature is held at 25° C.

Figure 3:
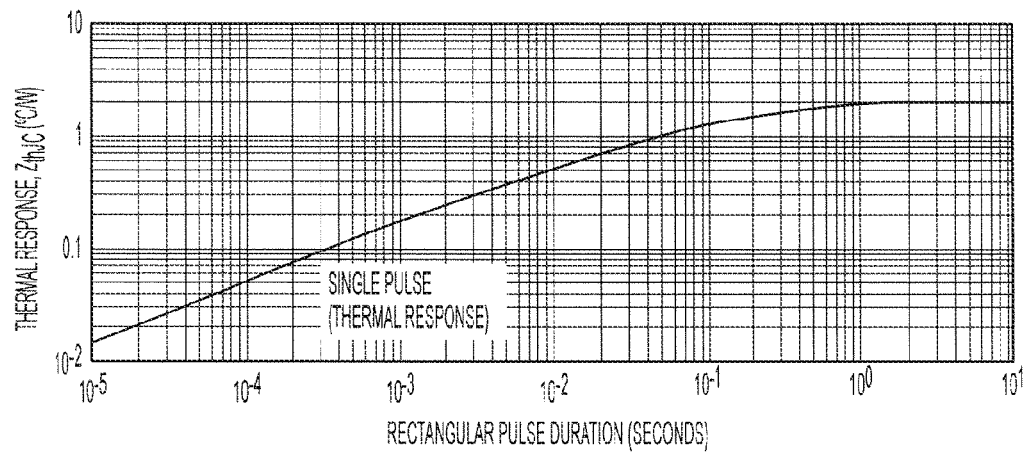
FIG. 3 illustrates an example of a transient thermal impedance plot.

The SOA plot is usually derived from a MOSFET's "transient thermal impedance". FIG. 3 shows an example of the transient thermal impedance plot reproduced from the Vishay IRF530 datasheet. Given the transient thermal impedance and the MOSFET power dissipation (versus time), one can calculate the junction temperature rise.

Figure 1:
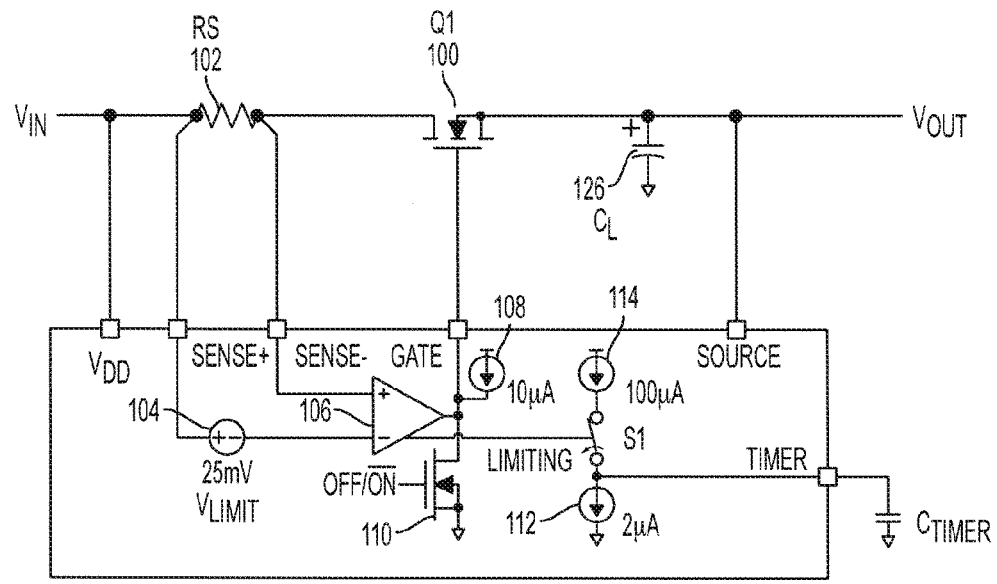
FIG. 1 illustrates a conventional hot swap controller.
Figure 4:
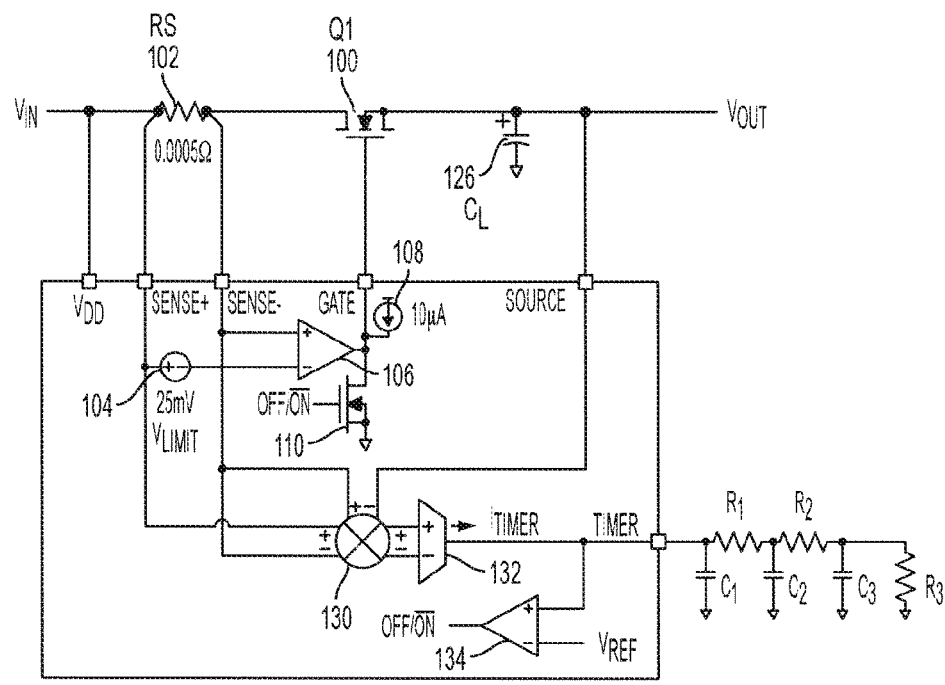
FIG. 4 shows an exemplary embodiment of a protection circuit for protecting a MOSFET in a hot swap controller.

FIG. 4 shows an exemplary embodiment of a MOSFET protection circuit of the present disclosure that protects a MOSFET 100 in a hot swap circuit similar to the circuit shown in FIG. 1 by replacing the conventional timer shown in FIG. 1 with a network of resistors and capacitors (RC network) fed by a current proportional to MOSFET power dissipation. This current is identified as $I_{TIMER}$ current in FIG. 4.

For example, the RC network may include resistors R1, R2, R3 and capacitors C1, C2, C3 arranged as shown in FIG. 4. When the voltage across the RC network reaches a specified value $V_{REF}$, the MOSFET 100 is switched off. The $I_{TIMER}$ current and the RC network represent an analog model of the MOSFET thermal behavior in the electrical domain. The voltage at the node where the $I_{TIMER}$ current is injected is proportional to the junction-to-case temperature rise. By configuring the proper RC network, it is possible to control the hot swap circuit to turn off the MOSFET 100 automatically at the moment the MOSFET 100 reaches its maximum junction temperature.

In the example shown in FIG. 4, the MOSFET protection circuit includes an analog multiplier 130 that multiplies the value of the MOSFET current and the value of the voltage across the MOSFET to produce an output voltage. The value of the MOSFET current may be sensed by the sense resistor 102 ($R_S$) and may be provided to an input of the analog multiplier 130 as a voltage supplied from nodes SENSE+ and SENSE− of the hot swap circuit. The MOSFET voltage value supplied to the other input of the analog multiplier 130 may be represented by a voltage between drain and source terminals of the MOSFET 100 sensed across nodes SENSE− and SOURCE of the hot swap circuit.

The output voltage of the analog multiplier 130 is supplied to differential inputs of a transconductance amplifier 132 that produces the $I_{TIMER}$ current proportional to power dissipation of the MOSFET 100.

Alternatively, assuming the voltage across the MOSFET 100 is significant only when the circuit is in a current limit mode, the $I_{TIMER}$ current may be produced by the transconductance amplifier 132 with its input voltage proportional to the voltage observed across the MOSFET 100.

The $I_{TIMER}$ current flows through the RC network that produces a voltage compared by a comparator 134 with a predetermined reference voltage Vref. When the voltage produced by the RC network reaches the reference voltage Vref, the MOSFET 100 is turned off. For example, the output signal of the comparator 134 may be supplied to the gate of the MOSFET 110 to turn off MOSFET 100.

The RC network may be configured to represent an electric analog model of a desired thermal behavior associated with any MOSFET. In particular, the configuration of the RC network for a particular MOSFET may involve selection of a desired number of resistive and capacitive elements in the RC network and selection of their resistance and capacitance values. The RC network may be configured to represent any desired RC thermal model such as a Foster model or Cauer model.

Hence, to provide an appropriate protection of a MOSFET, the customer is only required to select the MOSFET that satisfies the SOA required for normal operating conditions. The MOSFET is automatically turned off before it is subjected to any condition that would exceed its SOA rating.

Figure 5:
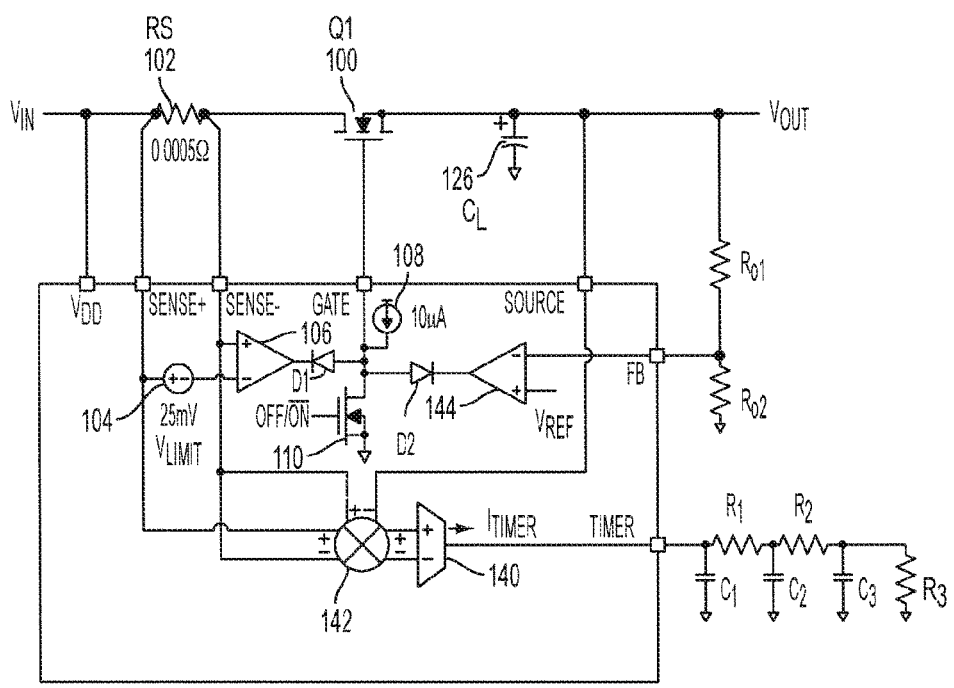
FIG. 5 shows an exemplary embodiment of a protection circuit for protecting a MOSFET in a surge stopper circuit.

FIG. 5 illustrates an exemplary embodiment of a MOSFET protection circuit that protects MOSFETs in a surge stopper circuit that implements the hot swap functionality described above in connection with FIG. 1, but additionally limits an output voltage Vout to a maximum value which may be configured with a user selectable resistor divider Ro1, Ro2. Alternatively, the output voltage may be fixed internally inside the integrated circuit.

In addition to elements shown in FIG. 1, the surge stopper circuit in FIG. 5 includes a resistor divider Ro1 and Ro2 coupled to the output terminal Vout. A common node between the resistors Ro1 and Ro2 is coupled to a feedback node FB of the surge stopper circuit.

The MOSFET protection circuit in FIG. 5 includes a configurable RC circuit having resistive elements R1, R2, R3 and capacitive elements C1, C2, C3, a transconductance amplifier 140 for producing current $I_{TIMER}$ supplied to the RC circuit, an analog multiplier 142 coupled to differential inputs of the transconductance amplifier and an amplifier 144. The output of the current limit amplifier 106 is coupled to the gate of the MOSFET 100 via a diode D1, and the output of the amplifier 144 is coupled to the gate of the MOSFET 100 via a diode D2.

The analog multiplier 142 multiplies the value of the MOSFET current sensed by the sense resistor 102 and the value of the voltage across the MOSFET 100 to produce an output voltage. The value of the MOSFET current may be provided to an input of the analog multiplier 142 as a voltage supplied from nodes SENSE+ and SENSE− of the surge stopper circuit. The MOSFET voltage value supplied to the other input of the analog multiplier 142 may be represented by a voltage between drain and source terminals of the MOSFET 100 sensed across nodes SENSE− and SOURCE of the surge stopper circuit.

Alternatively, assuming the voltage across the MOSFET 100 is significant only when the circuit is in a current limit mode, the $I_{TIMER}$ current may be produced by the transconductance amplifier 140 with its input voltage proportional to the voltage observed across the MOSFET 100. This alternative implementation is possible because at those times when the surge stopper circuit is not in a current limit mode, the voltage across MOSFET 100 is negligible and the $I_{TIMER}$ current is substantially at a zero level. When the surge stopper circuit is in a current limit mode, the $I_{TIMER}$ current is proportional to the voltage across the MOSFET 100. Because the current limit operation forces the MOSFET current to a fixed value, the resulting $I_{TIMER}$ current is therefore proportional to the power across the MOSFET 100. When the voltage at the RC network reaches a prescribed value, the MOSFET 100 is turned off.

Similar to the circuit in FIG. 4, the RC circuit in FIG. 5 can be configured to reproduce any desired thermal behavior of the MOSFET 100. In particular, any selected number of resistive and capacitive elements having any selected resistance and capacitance values may be included in the RC circuit to simulate a thermal behavior of the MOSFET 100. The RC circuit in FIG. 5 may be configured to represent any desired RC thermal model such a Foster model or a Cauer model.

Figure 6:
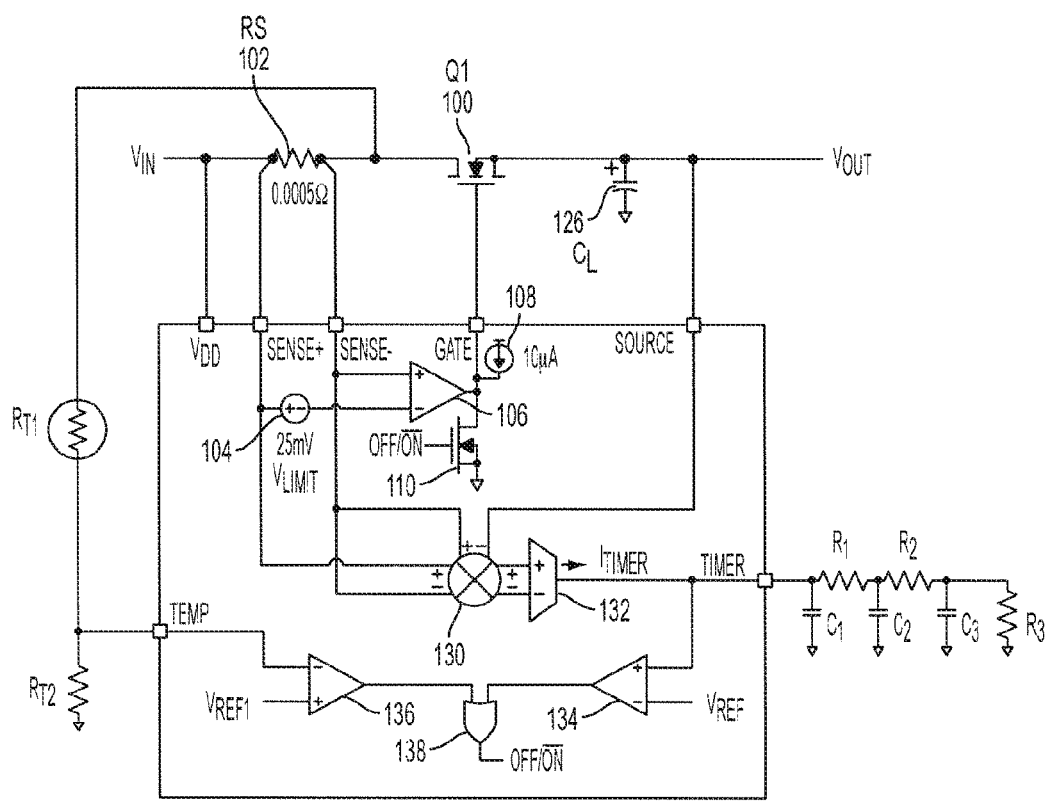
FIG. 6 illustrates an exemplary embodiment of a protection circuit with MOSFET case temperature sensing for protecting a MOSFET in a hot swap controller.

FIG. 6 illustrates a MOSFET protection circuit of the present disclosure that protects a MOSFET 100 in a hot swap circuit. This protection circuit is similar to the circuit in FIG. 4, but adds to this circuit the ability to turn off the MOSFET 100 when the case temperature of MOSFET 100 exceeds a predetermined threshold. A resistive divider composed of resistors $R_{T1}$ and $R_{T2}$ is connected between the MOSFET drain and ground and one or both of these resistors have a specified temperature coefficient. For example, in FIG. 6, it is assumed that the resistor $R_{T1}$ connected to the MOSFET drain has a positive temperature coefficient and the resistor $R_{T2}$ connected to ground has a negligible temperature coefficient. In most commercially available MOSFETs, the drain is the portion of the case with the best thermal connection to the MOSFET silicon die. If another portion of the MOSFET case (such as the source terminal) has a better thermal connection to the silicon die, the top resistor alternatively could be connected to that terminal instead. The MOSFET case temperature threshold is detected when the voltage at the common node TEMP of the resistive divider crosses a predefined voltage $V_{REF1}$ indicating that the case temperature of the MOSFET 100 exceeds a predetermined threshold.

In particular, a comparator 136 may have an inverting input coupled to the TEMP node and a non-inverting input supplied with the $V_{REF1}$ voltage. The output of the comparator 136 is connected to an input of an OR gate circuit 138, the other input of which is connected to the output of the comparator 134. When either the voltage produced by the RC network reaches the reference voltage Vref, or the voltage at the TEMP node exceeds the $V_{REF1}$ voltage, the output of the OR gate 138 produces a signal supplied to the gate of the MOSFET 110 to turn off the MOSFET 100.

Figure 7:
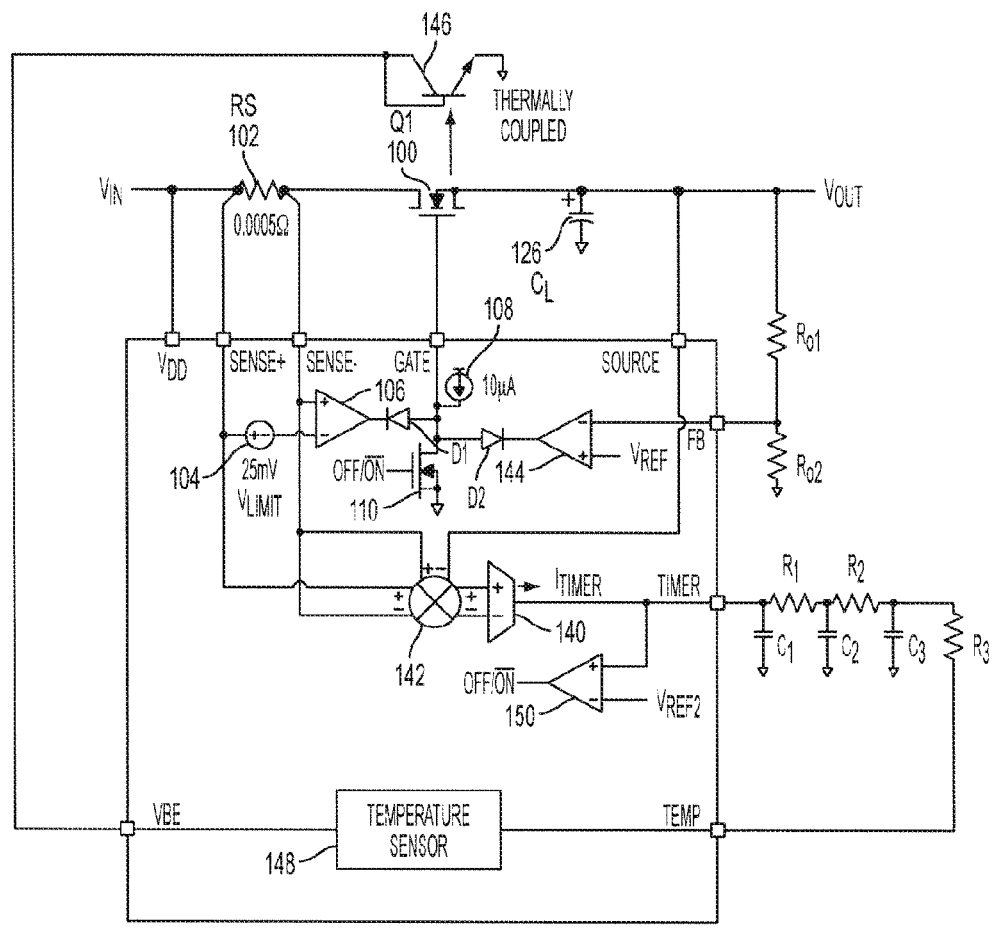
FIG. 7 shows an exemplary embodiment of a protection circuit with MOSFET case temperature sensing and producing a temperature dependent voltage at a terminal of an RC thermal network in a surge stopper circuit.

FIG. 7 illustrates a MOSFET protection circuit that protects MOSFETs in a surge stopper circuit. This circuit is similar to the circuit in FIG. 5, but adds to this circuit the ability to sense the case temperature of the MOSFET and produce a voltage at one terminal of the RC thermal network.

In the example shown in FIG. 7, a diode-connected NPN transistor 146 is thermally coupled to the MOSFET 100 to sense the case temperature of the MOSFET 100. For example, the NPN transistor 146 may be arranged on a PC board in close proximity to the MOSFET 100. Alternatively, if the MOSFET 100 is mounted to a heatsink, the NPN transistor 146 may be thermally connected to and electrically isolated from the heatsink using a heatsink pad made from a material such as silicone elastomer or mica.

The emitter of the transistor 146 is grounded. The base and collector of the transistor 146 via a node VBE is coupled to a temperature sensor 148 which produces at a node TEMP a voltage proportional to the case temperature of the MOSFET 100. The TEMP node is connected to a terminal of the RC thermal network, and the output of this network is connected to the TIMER node. By producing a voltage proportional to the MOSFET case temperature at the TIMER terminal of the RC thermal network, it is possible to reduce the number of resistors and capacitors necessary to accurately produce a voltage at the TEMP node that is proportional to the silicon die temperature over both short and long time durations.

The $I_{TIMER}$ current flows through the RC thermal network that produces a voltage compared by a comparator 150 with a predetermined reference voltage $V_{REF2}$. When the voltage produced by the RC network reaches the reference voltage $V_{REF2}$, the output signal of the comparator 150 supplied to the gate of the MOSFET 110 turns off the MOSFET 100.

The MOSFET protection of the present disclosure can also be applied to linear regulators. Like surge stoppers, linear regulators also limit the output voltage to a maximum value which may be configured with a user selectable resistor divider or fixed internally inside the integrated circuit.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

What is claimed is:

1. A system for supplying power from an input node to an output node, the system comprising surge stopper circuitry including a semiconductor element that includes a MOSFET in a case, the surge stopper circuitry comprising:
    a circuit for protecting the semiconductor element, comprising:
        an analog multiplier responsive to a voltage across the semiconductor element and a current flowing through the semiconductor element to produce an output voltage representing a product of values representing the voltage across the semiconductor element and the current in the semiconductor element,
        a transconductance amplifier coupled to an output of the analog multiplier for receiving the output voltage of the analog multiplier to produce an output current,
        an analog RC circuit coupled to the output of the transconductance amplifier and configurable to include a selected number of resistive elements having selected resistance values and a selected number of capacitive elements having selected capacitance values, the RC circuit being configurable to provide an RC thermal model that reproduces a desired thermal behavior of the semiconductor element, the RC circuit being responsive to the output current of the transconductance amplifier to produce an output voltage, and
    a comparator for comparing the output voltage of the RC circuit with a reference voltage to produce a control signal supplied to the semiconductor element, and
    a sensor that senses the temperature of the MOSFET case, wherein the circuit has a configuration that
        supplies a voltage that is proportional to case temperature to a node of the RC circuit to produce a thermal model with the desired thermal behavior of the semiconductor element.

2. The circuit of claim 1, wherein the MOSFET is coupled to a sense resistor configured for sensing the MOSFET current.

3. The circuit of claim 2, wherein a first input of the analog multiplier is configured for receiving a voltage across the sense resistor.

4. The circuit of claim 3, wherein a second input of the analog multiplier is configured for receiving a voltage between source and drain terminals of the MOSFET.

5. The circuit of claim 1, wherein the output current of the transconductance amplifier represents power dissipation of the semiconductor element.

6. The circuit of claim 1, wherein the MOSFET current is limited to a fixed value, and the voltage across the drain and source terminals of the MOSFET determines the current at the input of the RC circuit.

7. The circuit of claim 1, wherein the surge stopper circuit includes a resistor divider coupled to the output node, and a feedback node provided in a common node between resistive elements of the resistor divider.

8. The circuit of claim 1, wherein the RC circuit represents a Cauer thermal model.

9. The circuit of claim 1, wherein the RC circuit represents a Foster thermal model.

10. The circuit of claim 1, wherein a diode-connected transistor is used to detect the MOSFET case temperature.

11. The circuit of claim 10, wherein the voltage proportional to the MOSFET case temperature is supplied to a node coupled in series with a resistor of a Cauer thermal network.

* * * * *